(12) United States Patent
Kawai

(10) Patent No.: US 11,417,786 B2
(45) Date of Patent: Aug. 16, 2022

(54) PHOTOELECTRIC CONVERSION MODULE

(71) Applicant: IDEMITSU KOSAN CO., LTD., Tokyo (JP)

(72) Inventor: Takaaki Kawai, Tokyo (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 17/264,252

(22) PCT Filed: Jul. 30, 2019

(86) PCT No.: PCT/JP2019/029778
§ 371 (c)(1),
(2) Date: Jan. 28, 2021

(87) PCT Pub. No.: WO2020/027104
PCT Pub. Date: Feb. 6, 2020

(65) Prior Publication Data
US 2021/0296519 A1 Sep. 23, 2021

(30) Foreign Application Priority Data

Jul. 30, 2018 (JP) .............................. JP2018-142383

(51) Int. Cl.
*H01L 31/05* (2014.01)
*H01L 31/048* (2014.01)

(52) U.S. Cl.
CPC ........ *H01L 31/0504* (2013.01); *H01L 31/048* (2013.01)

(58) Field of Classification Search
CPC .......................... H01L 31/0504; H01L 31/048
See application file for complete search history.

(56) References Cited

U.S. PATENT DOCUMENTS

2016/0240697 A1 8/2016 Sung

FOREIGN PATENT DOCUMENTS

JP 2011-238640 A 11/2011
JP 2014-090160 A 5/2014

OTHER PUBLICATIONS

Physics Factbook, Jane Golubovskaya, 2004 (Year: 2004).*
Volume Resistivity, Dec. 22, 2015, accessed Nov. 17, 2021, wayback machine citation provided (Year: 2015).*
Machine Translation JP 2011238640, accessed Nov. 17, 2021 (Year: 2011).*
International Searching Authority, "International Search Report," issued in connection with International Patent Application No. PCT/JP2019/029778, dated Oct. 8, 2019.
International Searching Authority, "Written Opinion," issued in connection with International Patent Application No. PCT/JP2019/029778, dated Oct. 8, 2019.

* cited by examiner

*Primary Examiner* — Shannon M Gardner
(74) *Attorney, Agent, or Firm* — Foley & Lardner LLP

(57) ABSTRACT

A photoelectric conversion module 100 comprises: a glass substrate 20; a photoelectric conversion cell 12 provided on a first surface side of the glass substrate 20; a pair of wirings 50 electrically connected to the photoelectric conversion cell, the wirings pulled out to a second surface side, the second surface side being an opposite side of the first surface of the glass substrate 20; and an insulator 60 provided between a positive-polarity wiring of the pair of wirings 50 and the second surface of the glass substrate 20.

8 Claims, 11 Drawing Sheets

PHOTOELECTRIC CONVERSION MODULE

CROSS-REFERENCE TO RELATED APPLICATIONS

The present application claims priority under 37 U.S.C. § 371 to International Patent Application No. PCT/JP2019/029778, filed Jul. 30, 2019, which claims priority to and the benefit of Japanese Patent Application No. 2018-142383, filed on Jul. 30, 2018. The contents of these applications are hereby incorporated by reference in their entireties.

TECHNICAL FIELD

The present invention relates to a photoelectric conversion module such as a solar cell module.

BACKGROUND ART

There is known a photoelectric conversion module such as a solar cell module including a plurality of photoelectric conversion cells (the following Patent Literature 1). In a photoelectric conversion module described in Patent Literature 1, a photoelectric conversion cell includes a transparent electrode layer located on a light-receiving surface; a back-surface electrode layer located on a surface on an opposite side to the light-receiving surface; and a photoelectric conversion layer between the transparent electrode layer and the back-surface electrode layer.

In Patent Literature 1, a plurality of photoelectric conversion cells is provided on a glass substrate and is electrically connected in series with each other. A pair of wirings (bus bars) attached to back-surface electrode layers is provided at locations adjacent to photoelectric conversion cells located at both edge portions of the photoelectric conversion module. The pair of wirings is pulled out to a backside of the glass substrate, i.e., a surface on an opposite side to the photoelectric conversion cells. The pair of wirings pulled out to the backside of the glass substrate is connected to a relay (junction box). The relay is electrically connected to another solar cell module or an external electrical system by an electric cable.

CITATION LIST

Patent Literature

Patent Literature 1: US 2016/240697 A1

SUMMARY

The inventor of the present application has conducted an electroluminescence test (EL test) on a solar cell module that has been subjected to an accelerated aging test. The EL test is a test for allowing photoelectric conversion cells of the solar cell module to emit light by applying voltage to a pair of terminals of the solar cell module from an external source. In the EL test, conditions of deterioration of the photoelectric conversion cells can be tested by observing the light emission states of the photoelectric conversion cells.

The inventor of the present application has conducted an EL test and has found that photoelectric conversion cells are slightly deteriorated in a region on a backside of a glass substrate where a positive-polarity wiring is located. Namely, it has been newly found that long-term use of the solar cell module deteriorates the photoelectric conversion cells in the region where the positive-polarity wiring is provided.

Thus, a photoelectric conversion module capable of suppressing long-term deterioration is desired.

A photoelectric conversion module according to one aspect comprises: a glass substrate; a photoelectric conversion cell provided on a first surface side of the glass substrate; a pair of wirings electrically connected to the photoelectric conversion cell, the wirings pulled out to a second surface side, the second surface side being an opposite side of the first surface of the glass substrate; and an insulator provided between a positive-polarity wiring of the pair of wirings and the second surface of the glass substrate.

According to the above aspect, a long-term deterioration of the photoelectric conversion module can be suppressed.

DESCRIPTION OF EMBODIMENTS

Figure 1:
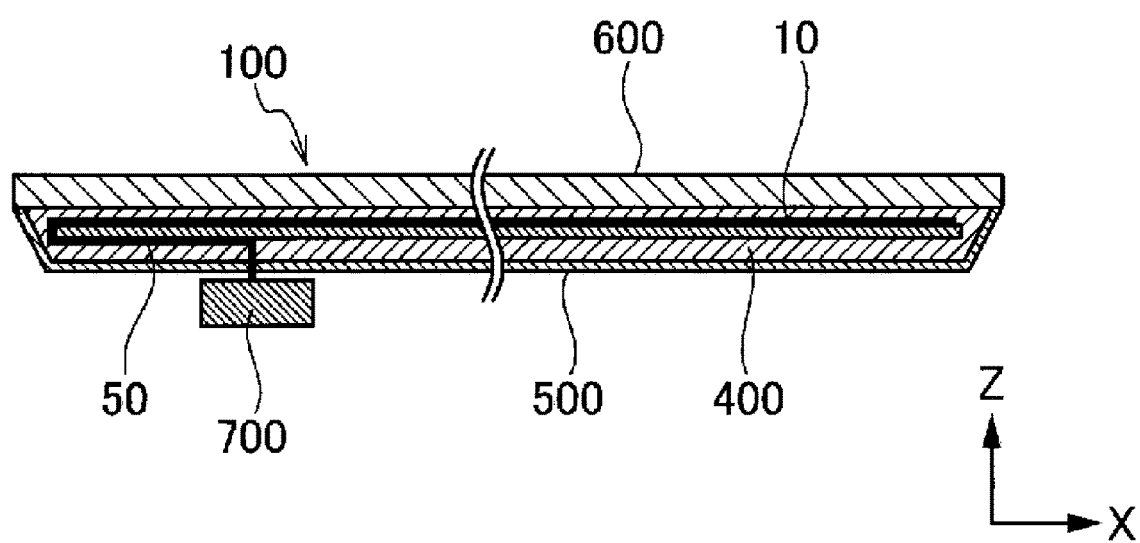
FIG. 1 is a schematic cross-sectional view of a photoelectric conversion module according to one embodiment.

Hereinafter, embodiments will be described with reference to the drawings. In the drawings, the same or similar parts are denoted by the same or similar reference numerals. However, it should be noted that the drawings are schematic and ratios or the like of dimensions may be different from actual ones.

Figure 2:
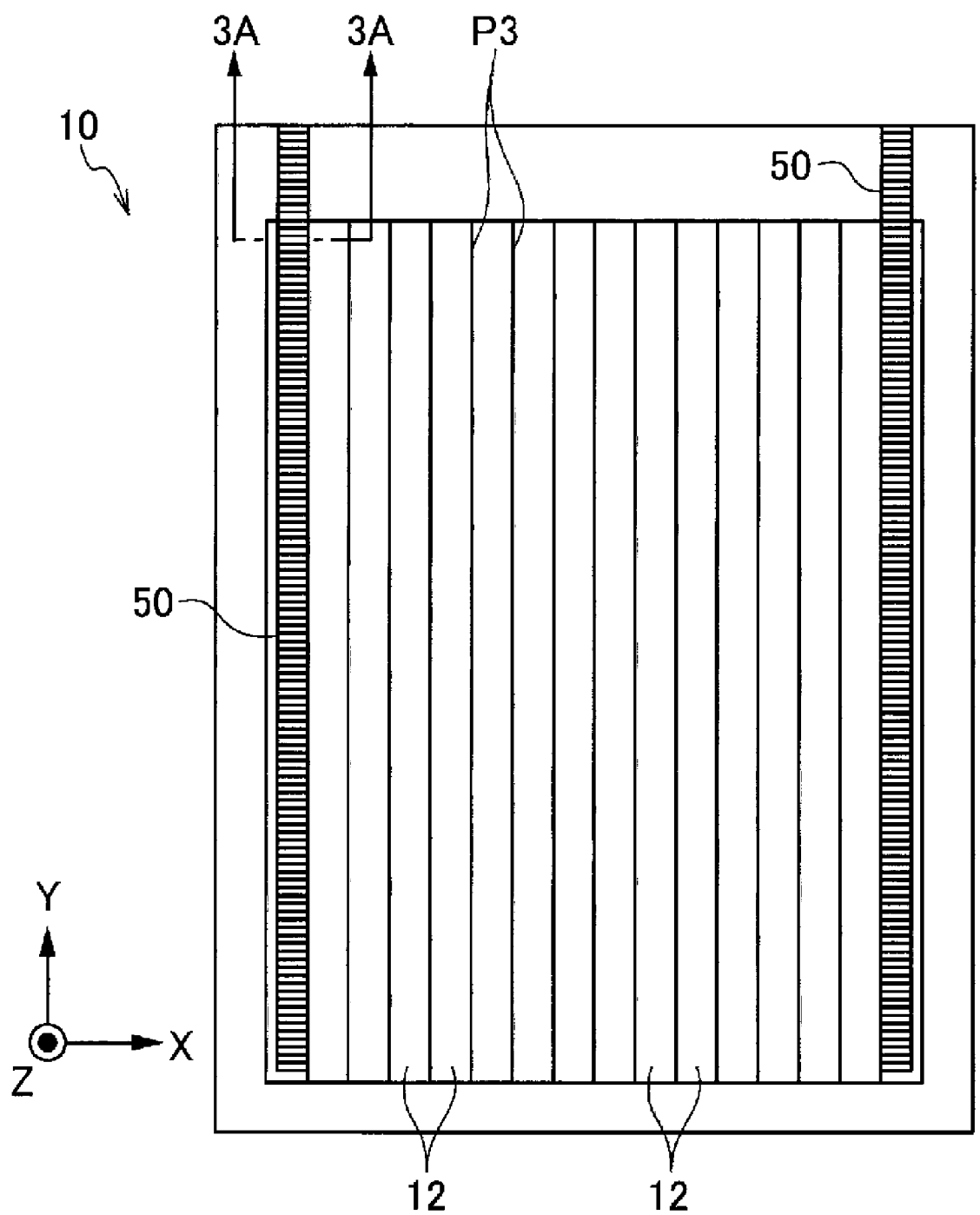
FIG. 2 is a schematic plan view of a photoelectric conversion element included in the photoelectric conversion module.
Figure 3:
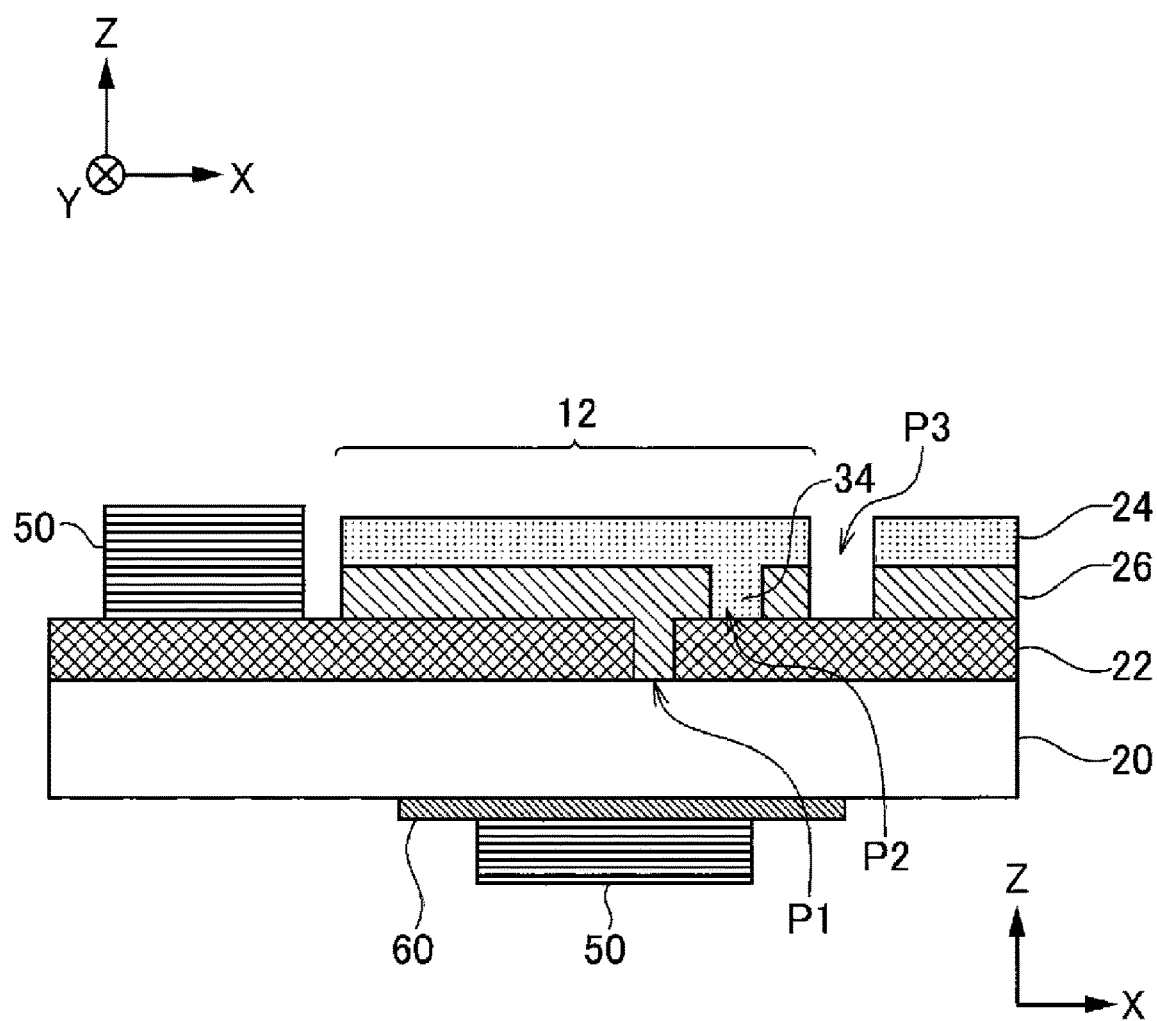
FIG. 3 is a schematic cross-sectional view of the photoelectric conversion element taken along line 3A-3A of FIG. 2.
Figure 4:
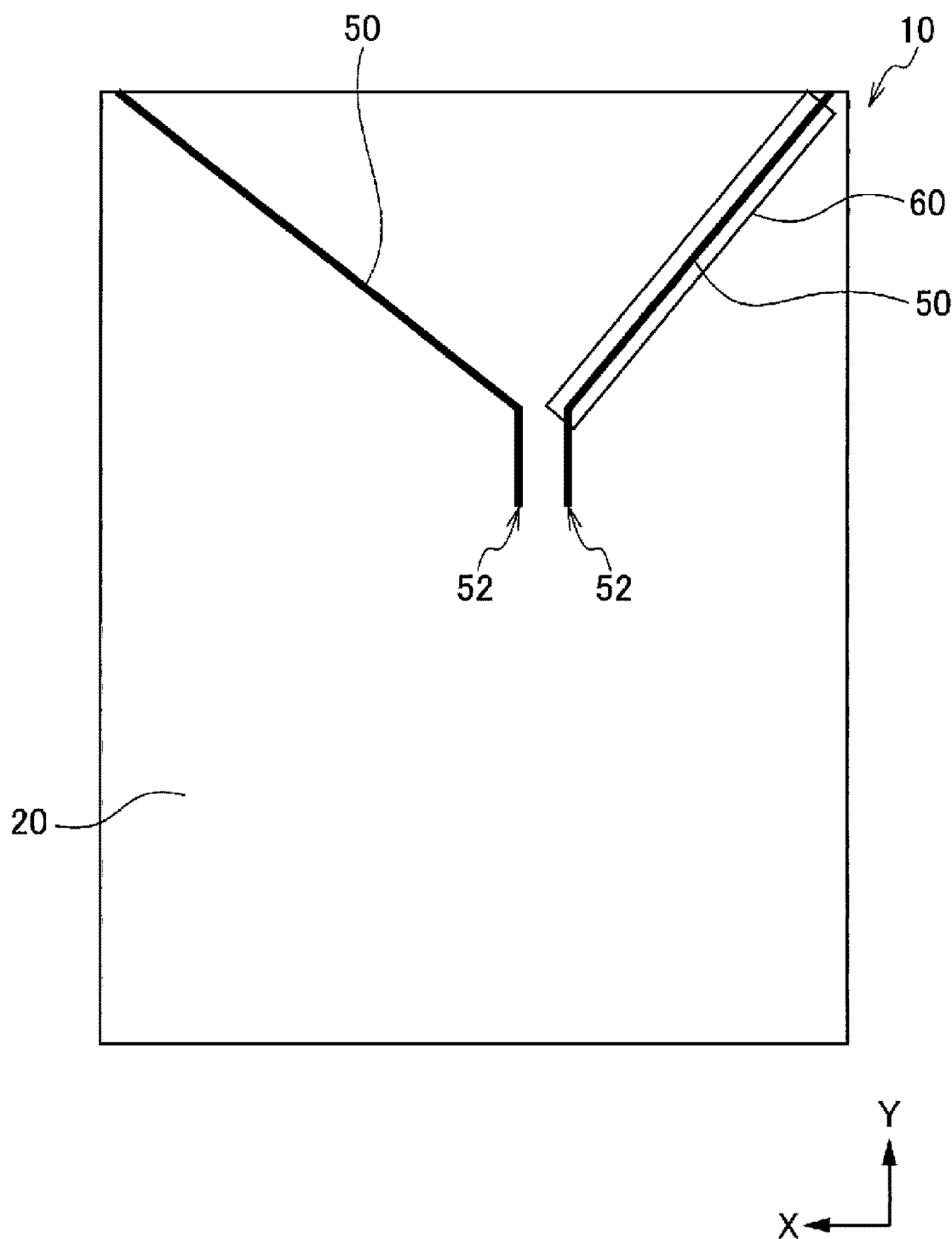
FIG. 4 is a schematic plan view showing a back surface (second surface) of a glass substrate included in the photoelectric conversion element.

FIG. 1 is a schematic cross-sectional view of a photoelectric conversion module according to one embodiment. FIG. 2 is a schematic plan view of the photoelectric conversion module. FIG. 3 is a schematic cross-sectional view of a panel taken along line 3A-3A of FIG. 2. FIG. 4 is a schematic plan view showing a back surface (second surface) of a glass substrate included in the panel.

A photoelectric conversion module 100 according to the present embodiment may be a solar cell module that converts light energy into electrical energy. The photoelectric conversion module 100 may be, for example, an integrated thin-film photoelectric conversion module. The photoelectric conversion module 100 may include a photoelectric conversion element 10, a sealing layer 400 that seals the photoelectric conversion element 10, and a transparent substrate 600 provided on a light-receiving side of the sealing layer 400. The transparent substrate 600 may be, for example, a glass substrate. A protective sheet 500 may be provided on a backside of the sealing layer 400, i.e., on an opposite side of the sealing layer 400 from a light-receiving surface.

The sealing layer 400 may cover a light-receiving side of the photoelectric conversion element 10 and an opposite side of a light-receiving surface of the photoelectric conversion element 10. The sealing layer 400 may be made of a synthetic resin. For such a synthetic resin, for example, EVA resin (ethylene-vinyl acetate copolymer resin) can be used.

The sealing layer 400 may contain an ultraviolet absorber (UVA). In this case, the ultraviolet absorber may be contained only in a portion of the sealing layer 400 on the light-receiving surface side of the photoelectric conversion element 10, or may be contained only in a portion of the sealing layer 400 on an opposite side of the light-receiving surface of the photoelectric conversion element 10, or may be contained in both the light-receiving surface side and the opposite side of the light-receiving surface of the photoelectric conversion element 10.

When the ultraviolet absorber is contained in both the light-receiving surface side and the opposite side of the light-receiving surface of the photoelectric conversion element 10, the content of the ultraviolet absorber in the sealing layer 400 on the light-receiving surface side may be the same as or different from the content of the ultraviolet absorber in the sealing layer 400 on the opposite side of the light-receiving surface.

The photoelectric conversion element 10 may include a plurality of photoelectric conversion cells 12 integrated on a first surface side of a glass substrate 20 (FIG. 2). Each photoelectric conversion cell 12 may be substantially strip-shaped as viewed in a thickness direction of the photoelectric conversion element 10 (a direction orthogonal to a principal plane). Each photoelectric conversion cell 12 may extend to be long in a first direction (Y-direction in the drawings). The plurality of photoelectric conversion cells 12 are arranged in a second direction (X-direction in the drawings) intersecting the first direction. Photoelectric conversion cells 12 adjacent to each other may be electrically separated from each other by dividing portions P1, P2, and P3 extending in the first direction.

Each photoelectric conversion cell 12 may include at least a first electrode layer 22, a second electrode layer 24, and a photoelectric conversion layer 26. The photoelectric conversion layer 26 is provided between the first electrode layer 22 and the second electrode layer 24. The first electrode layer 22 is provided between the photoelectric conversion layer 26 and the glass substrate 20. The second electrode layer 24 is located on an opposite side of the photoelectric conversion layer 26 from the glass substrate 20.

In the present embodiment, the second electrode layer 24 may be constructed by a transparent electrode layer. When the second electrode layer 24 is constructed by the transparent electrode layer, light that enters the photoelectric conversion layer 26 passes through the second electrode layer 24.

When the second electrode layer 24 is constructed by a transparent electrode layer, the first electrode layer 22 may be constructed by an opaque electrode layer or may be constructed by a transparent electrode layer. The first electrode layer 22 may comprise, for example, a metal such as molybdenum, titanium or chromium.

In the present embodiment, as a preferred example, the second electrode layer 24 may comprise an n-type semiconductor, more specifically, a material having n-type conductivity, a wide band gap, and relatively low resistance. The second electrode layer 24 may comprise, for example, zinc oxide (ZnO) to which a group-III element is added or indium tin oxide (ITO). In this case, the second electrode layer 24 can serve as both an n-type semiconductor and a transparent electrode layer.

The photoelectric conversion layer 26 may include, for example, a p-type semiconductor. In an example of a CIS-based photoelectric conversion module, the photoelectric conversion layer 26 is formed of a compound semiconductor containing a group-I element (Cu, Ag, Au, etc.), a group-III element (Al, Ga, In, etc.), and a group-VI element (O, S, Se, Te, etc.). The photoelectric conversion layer 26 is not limited to the one described above, and may be made of any material that causes photoelectric conversion.

It is to be noted that the configuration of the photoelectric conversion cell 12 is not limited to the above-described mode and can take various modes. For example, the photoelectric conversion cell 12 may have a configuration in which both an n-type semiconductor and a p-type semiconductor are sandwiched between the first electrode layer and the second electrode layer. In this case, the second electrode layer may not comprise an n-type semiconductor. The structure of the photoelectric conversion cell 12 is not limited to a p-n junction, and may be a p-i-n junction including an intrinsic semiconductor layer (i-type semiconductor) between an n-type semiconductor and a p-type semiconductor.

The photoelectric conversion cell 12 may include a buffer layer which is not shown between the photoelectric conversion layer 26 and the second electrode layer 24. In this case, the buffer layer may include a semiconductor material having the same conductive type as the second electrode layer 24 or may include a semiconductor material having a different conductive type. The buffer layer may be made of any material as long as the material has a higher electrical resistance than the second electrode layer 24. The buffer layer may be, for example, a Zn-based buffer layer, a Cd-based buffer layer, or an In-based buffer layer.

The first electrode layers 22 of photoelectric conversion cells 12 adjacent to each other are electrically separated from each other by a dividing portion P1. Likewise, the second electrode layers 24 of the photoelectric conversion cells 12 adjacent to each other are electrically separated from each other by a dividing portion P3. The photoelectric conversion layers 26 of the photoelectric conversion cells 12 adjacent to each other are separated from each other by a dividing portion P2 and the dividing portion P3.

The photoelectric conversion element 10 may include an electrically connecting portion 34 between photoelectric conversion cells 12 adjacent to each other. The electrically connecting portion 34 electrically connects in series the photoelectric conversion cells 12 adjacent to each other. In the present embodiment, the electrically connecting portion 34 is formed of a portion that continues from the second electrode layer 24. In this case, the electrically connecting portion 34 may be made of the same material as the material of the second electrode layer 24. Alternatively, the electrically connecting portion 34 may be made of a conductive material different from the material of the second electrode layer 24. The electrically connecting portion 34 extends in the thickness direction of the photoelectric conversion element 10 at the second dividing portion P2, and thereby electrically connects the first electrode layer 22 of one of the photoelectric conversion cells 12 to the second electrode layer 24 of the other one of the photoelectric conversion cells 12.

When the photoelectric conversion layer 26 of each photoelectric conversion cell 12 is irradiated with light, an electromotive force is generated, resulting in the first electrode layer 22 and the second electrode layer 24 having a positive polarity and a negative polarity, respectively. Thus, some of free electrons generated in a photoelectric conversion cell 12 directly pass through an electrically connecting portion 34 from a second electrode layer 24 and move to a first electrode layer 22 of an adjacent photoelectric conversion cell 12. As such, free electrons generated in a photoelectric conversion cell 12 pass and flow through a plurality of photoelectric conversion cells 12 in the second direction (X-direction in the drawings).

The photoelectric conversion element 10 has a pair of wirings 50 for taking out electric power from the photoelectric conversion element 10. The pair of wirings 50 may be provided so as to be adjacent to photoelectric conversion cell 12 that is located at edges of the photoelectric conversion element 10 in the second direction (X-direction in the drawings). The pair of wirings 50 is electrically connected to a portion extended/exposed from first electrode layers 22 of photoelectric conversion cell 12 that is located at edges among the photoelectric conversion cells 12 arranged in one direction.

The pair of wirings 50 is pulled out to a second surface side which is an opposite side of the above-described first surface of the glass substrate 20, i.e., a surface on an opposite side to the photoelectric conversion cells 12 (see FIGS. 3 and 4). The pair of wirings 50 is pulled out to locations 52 where the wirings 50 are close to each other on a back surface of the glass substrate 20 (see FIG. 4). The pair of wirings 50 passes through the sealing layer 400 in the thickness direction from the locations 52 and is connected to a relay (junction box) 700 (see also FIG. 1).

One of the pair of wirings 50 is a positive-polarity wiring and the other one of the pair of wirings 50 is a negative-polarity wiring. An insulator 60 is provided between the positive-polarity wiring 50 and the back surface (second surface) of the glass substrate 20 (see FIGS. 3 and 4). A material that forms the insulator 60 is not particularly limited and may be, for example, resin materials such as polyethylene terephthalate (PET), polyester (PE), vinyl chloride, acrylonitrile butadiene styrene (ABS), and polycarbonate.

The insulator 60 may be formed by being coated on the back surface of the glass substrate 20 or may be constructed by an insulating tape adhered to the back surface of the glass substrate 20. The coating is not particularly limited and may be insulation coating such as silica. The insulating tape is not particularly limited and may be, for example, a Kapton (registered trademark) tape or a polyester insulating tape.

Instead of the above-described examples, the insulator 60 may be constructed by the sealing layer 400 that seals the photoelectric conversion element 10. In this case, the sealing layer 400 is configured to get into between the positive-polarity wiring 50 and the back side of the glass substrate 20.

The inventor of the present application has conducted EL tests after accelerated aging tests on a photoelectric conversion module that has the insulator 60 and on a photoelectric conversion module that does not have the insulator 60. As a result, it has been found that deterioration in a region at/around positive-polarity wiring 50 is suppressed in the photoelectric conversion module having the insulator 60 compared to the photoelectric conversion module that does not have the insulator 60. This reason is guessed as follows.

The glass substrate 20 normally contains alkaline components. Though the glass substrate 20 is an insulator, it is considered that the alkaline components (alkali ions) into the glass substrate 20 slightly move toward a front surface of the glass substrate 20 by long-term application of voltage. The alkali ions are positively charged. Thus, in a region around the positive-polarity wiring 50, the alkaline components move toward photoelectric conversion cells 12 in the glass substrate 20. It is guessed that this ion's movement causes weak leakage current passing through the glass substrate 20 from the positive-polarity wiring 50. Note that it is considered that such alkaline component's movement easily occurs particularly in a case that the glass substrate 20 is heated. Then, it is considered that when the alkaline components in the glass substrate 20 enter the photoelectric conversion cells 12, it affects the performance of the photoelectric conversion cells 12, causing deterioration of the photoelectric conversion cells 12.

In the present embodiment, since the insulator 60 is provided between the positive-polarity wiring 50 and the back surface of the glass substrate 20, weak leakage electric current passing through the glass substrate 20 from the positive-polarity wiring 50 can be suppressed. Therefore, an entry of the alkaline components in the glass substrate 20 into the photoelectric conversion cells 12 can be suppressed, enabling suppression of long-term deterioration of the photoelectric conversion module.

Preferably, the width of the insulator 60 in a direction orthogonal to a direction in which the positive-polarity wiring 50 extends on the back surface side of the glass substrate 20 may be larger than the width of the positive-polarity wiring 50 in the direction orthogonal to the direction in which the positive-polarity wiring 50 extends on the back surface side of the glass substrate 20. Accordingly, the influence of voltage applied from the positive-polarity wiring 50 can be further suppressed, enabling further suppression of deterioration of the photoelectric conversion cells 12.

It is preferred that the electrical resistivity (volume resistivity) of the insulator 60 be greater than the electrical resistivity (volume resistivity) of the glass substrate 20. Accordingly, it is considered that leakage current flowing through the glass substrate 20 in the thickness direction can be further suppressed, enabling further suppression of deterioration of the photoelectric conversion cells 12.

In terms of further suppression of leakage current flowing through the glass substrate 20 in the thickness direction, the electrical resistivity of the insulator 60 is preferably $10^{15}$ [Ω·cm] or more, and more preferably, $10^{16}$ [Ω·cm] or more.

In the above-described embodiment, there is an advantage, particularly in that the glass substrate 20 with a high alkaline component content can be used. Namely, limitations on the type of the glass substrate 20 used in the photoelectric conversion module 100 can be further eased.

The following table 1 shows results of EL tests conducted after accelerated aging tests on photoelectric conversion modules 100 that use different glass substrates 20 and different insulators 60. More specifically, table 1 shows results of EL tests on photoelectric conversion modules 100 that use three types of insulators 60 with different electrical resistivities for three types of glass substrates 20 with different alkali oxide contents. Note that in a case of not using an insulator 60, in EL tests, deterioration has been confirmed in all photoelectric conversion modules that use the above-described glass substrates 20.

TABLE 1

| | Electrical Resistivity [Ω·cm] | | |
| --- | --- | --- | --- |
| | $10^{15}$ | $10^{16}$ | $10^{17}$ |
| Amount of Alkaline Oxide Content in Glass Substrate [wt %] | 10.05 | ○ | ○ | ○ |
| | 14.00 | ○ | ○ | ○ |

In evaluation result fields of table 1, symbol "○" indicates that a deterioration improvement effect is high in the EL tests. As shown in table 1, in all glass substrates 20, a deterioration improvement has been able to be confirmed in the EL tests by using an insulator 60 having an electrical resistivity of at least $10^{15}$ Ω·cm or more.

In a mode shown in FIG. 4, the insulator 60 is provided on part of the back surface of the glass substrate 20 along the positive-polarity wiring 50. In this case, only a small amount of the insulator 60 is required, enabling suppression of an increase in manufacturing cost of the photoelectric conversion module 100. Alternatively, the insulator 60 may be provided on the entire back surface of the glass substrate 20. In this case, a location on the back side of the glass substrate 20 where the positive-polarity wiring 50 is pulled out can be flexibly changed.

The pair of wirings 50 may extend over a plurality of photoelectric conversion cells 12 as viewed in the thickness direction on the backside of the glass substrate 20. In this case, it is preferred that the number of photoelectric conversion cells 12 over which the positive-polarity wiring 50 extends be smaller than the number of photoelectric conversion cells 12 over which the negative-polarity wiring 50 extends. In this case, since the photoelectric conversion cells 12 are electrically connected in series with each other, potential differences between the positive-polarity wiring 50 and photoelectric conversion cells 12 at locations where the photoelectric conversion cells 12 face the positive-polarity wiring 50 can be minimized. By reducing the potential differences between the positive-polarity wiring 50 and the photoelectric conversion cells 12 at the locations where the photoelectric conversion cells 12 face the positive-polarity wiring 50, movement of alkali ions in the glass substrate 20 can be suppressed, enabling further suppression of deterioration of the photoelectric conversion cells 12.

A frame may be attached to edge sides of the photoelectric conversion module 100. Such a frame may include first frames 200 provided on short sides among four sides of the photoelectric conversion module 100; and second frames 300 provided on long sides among the four sides of the photoelectric conversion module 100.

Figure 5:
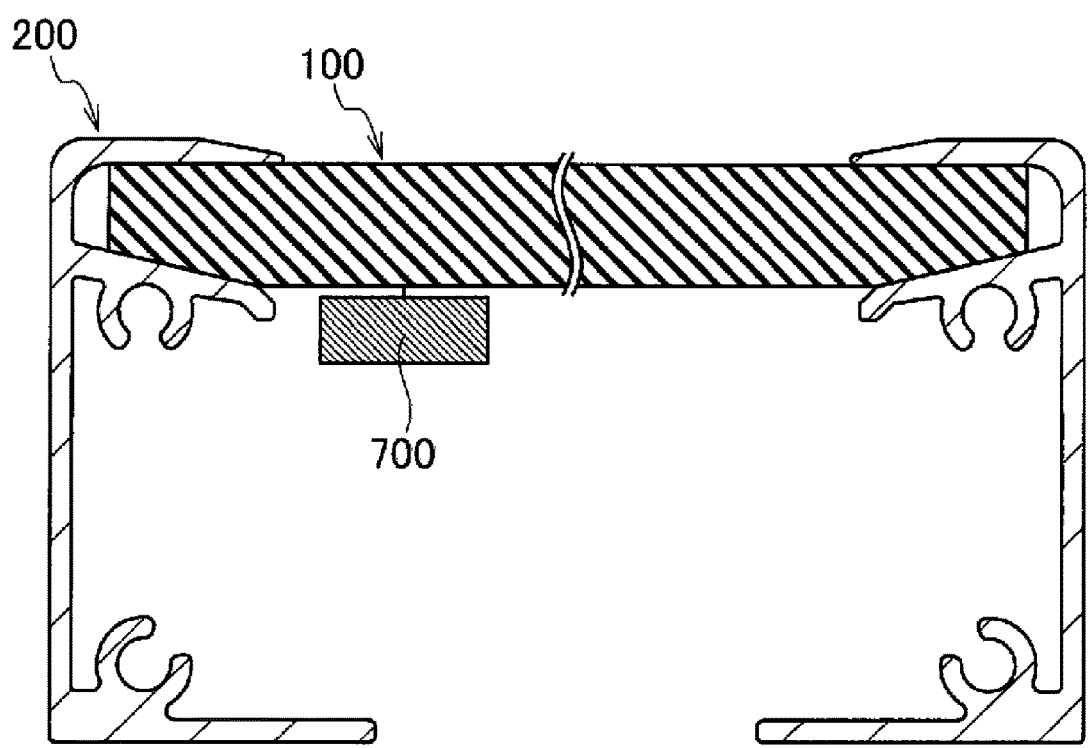
FIG. 5 is a schematic cross-sectional view of the photoelectric conversion module including a frame attached thereto.
Figure 6:
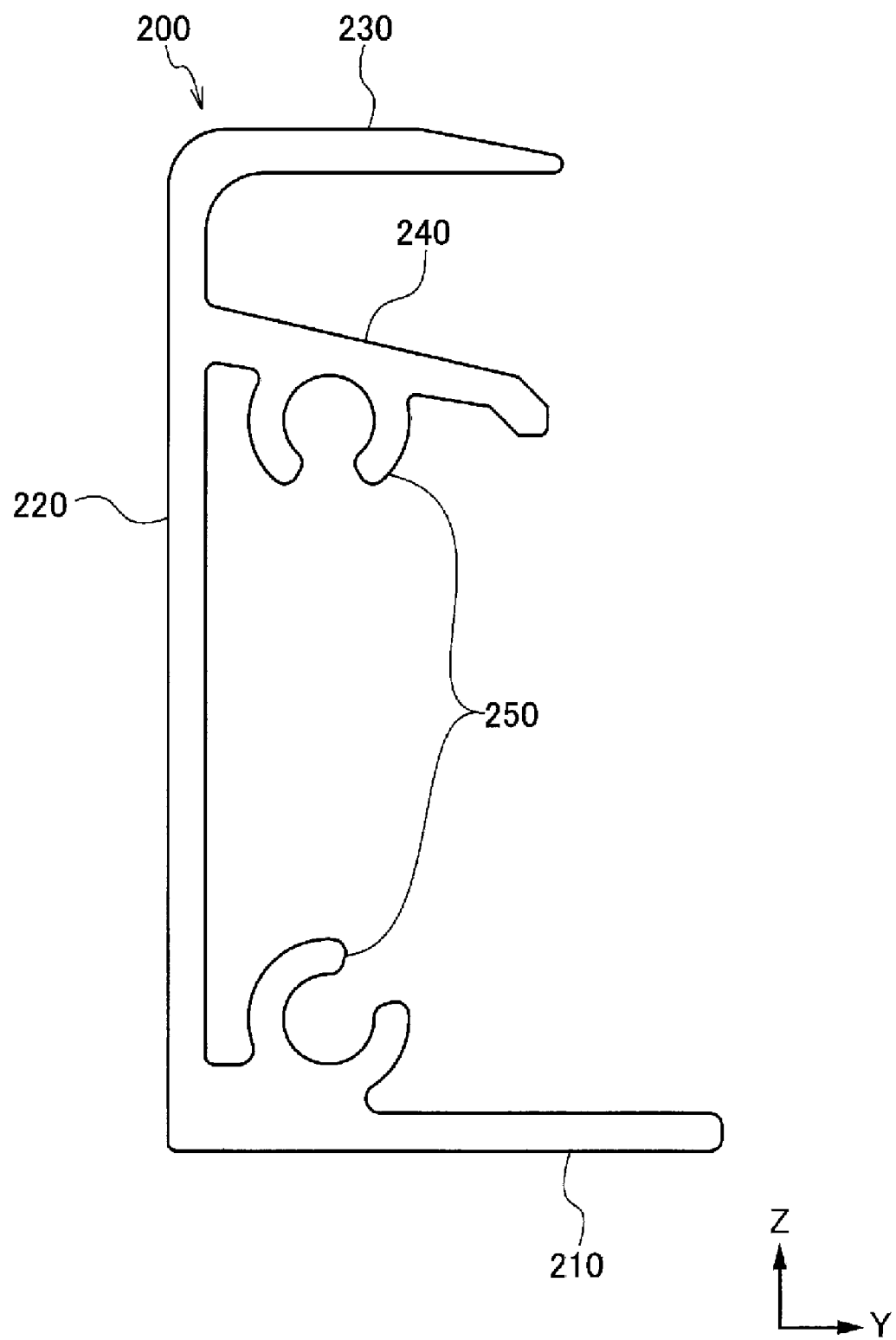
FIG. 6 is a side view of a first frame.
Figure 7:
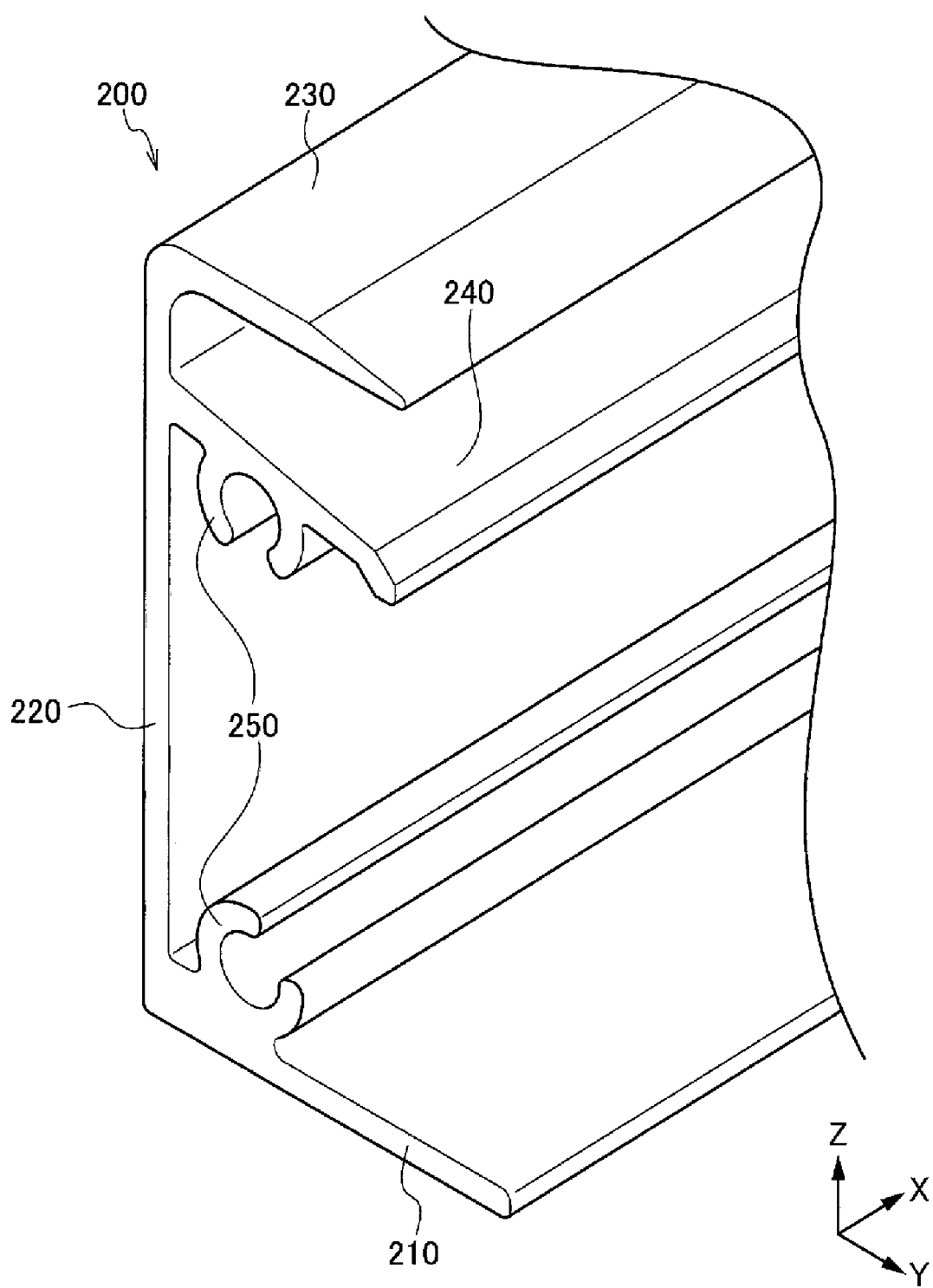
FIG. 7 is a perspective view of the first frame.
Figure 8:
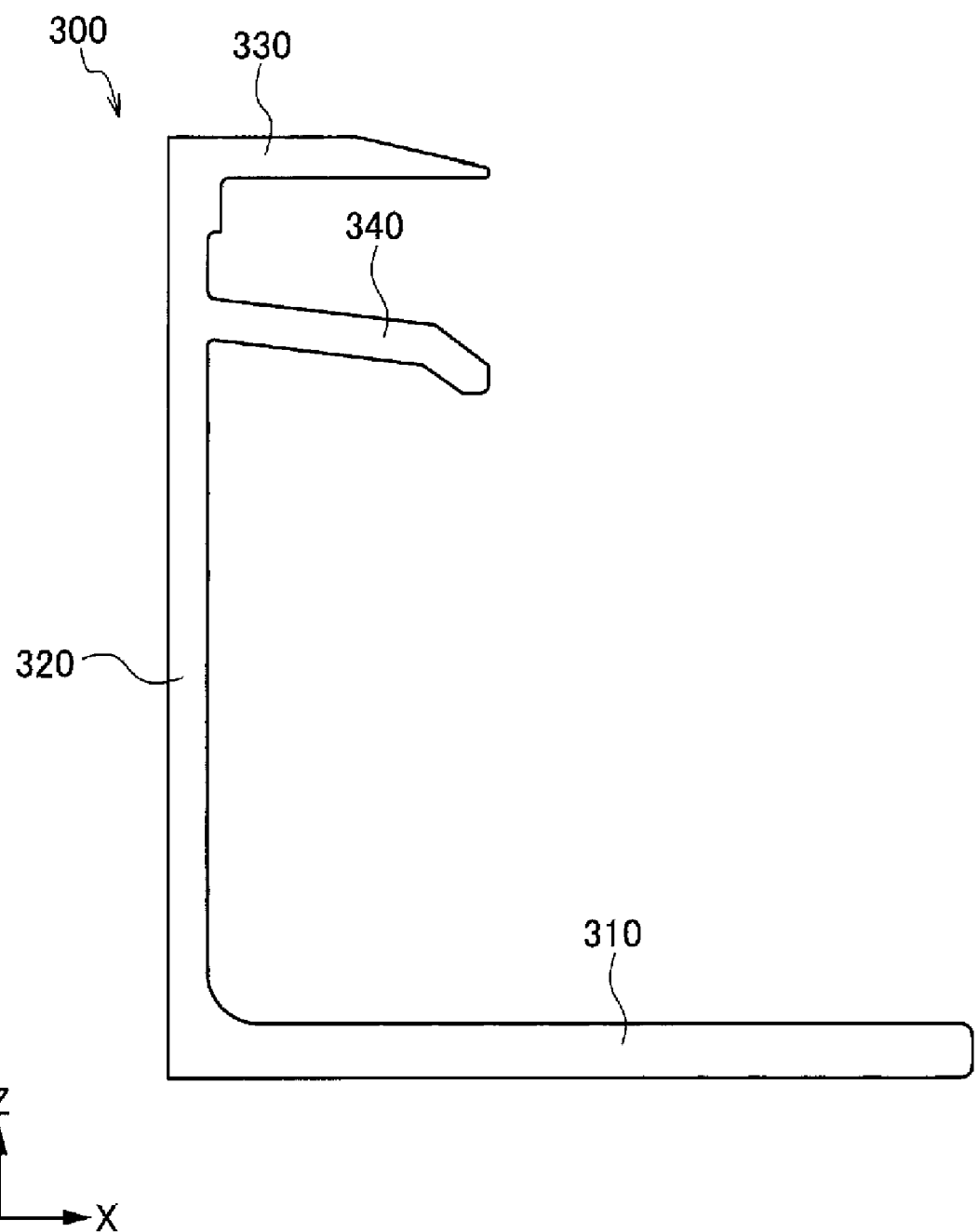
FIG. 8 is a side view of a second frame.
Figure 9:
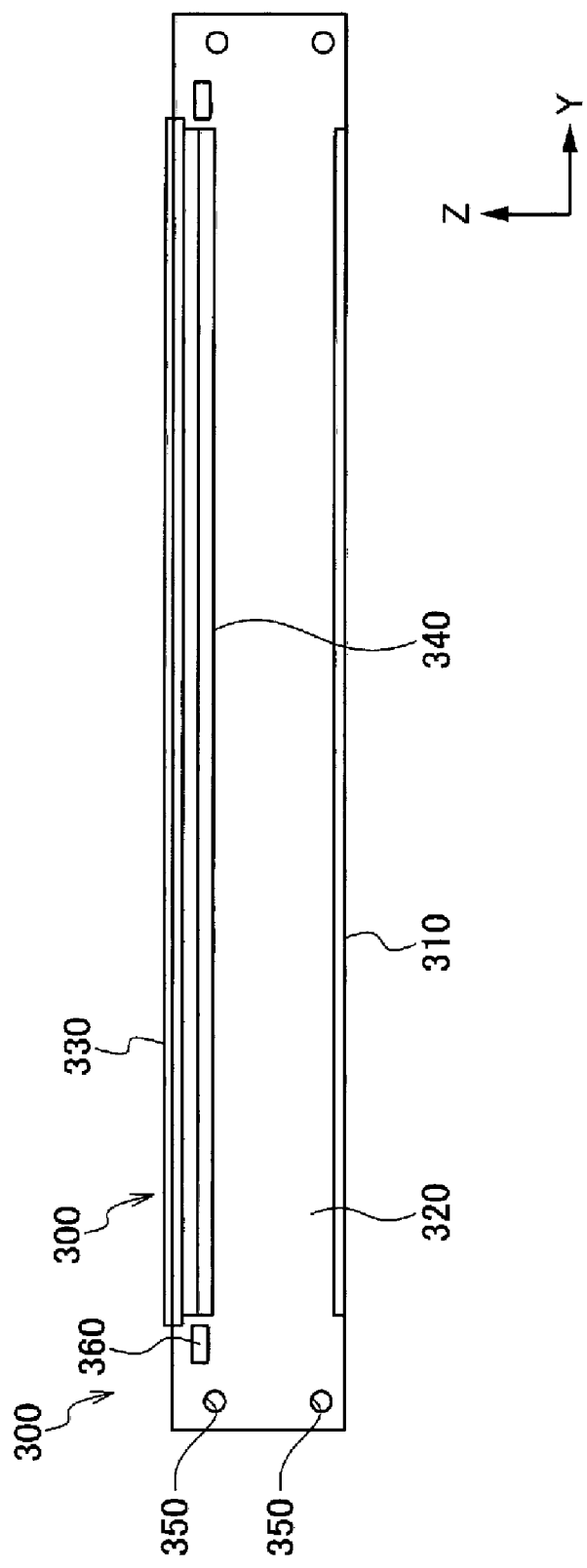
FIG. 9 is a plan view of the second frame as viewed in a different direction.
Figure 10:
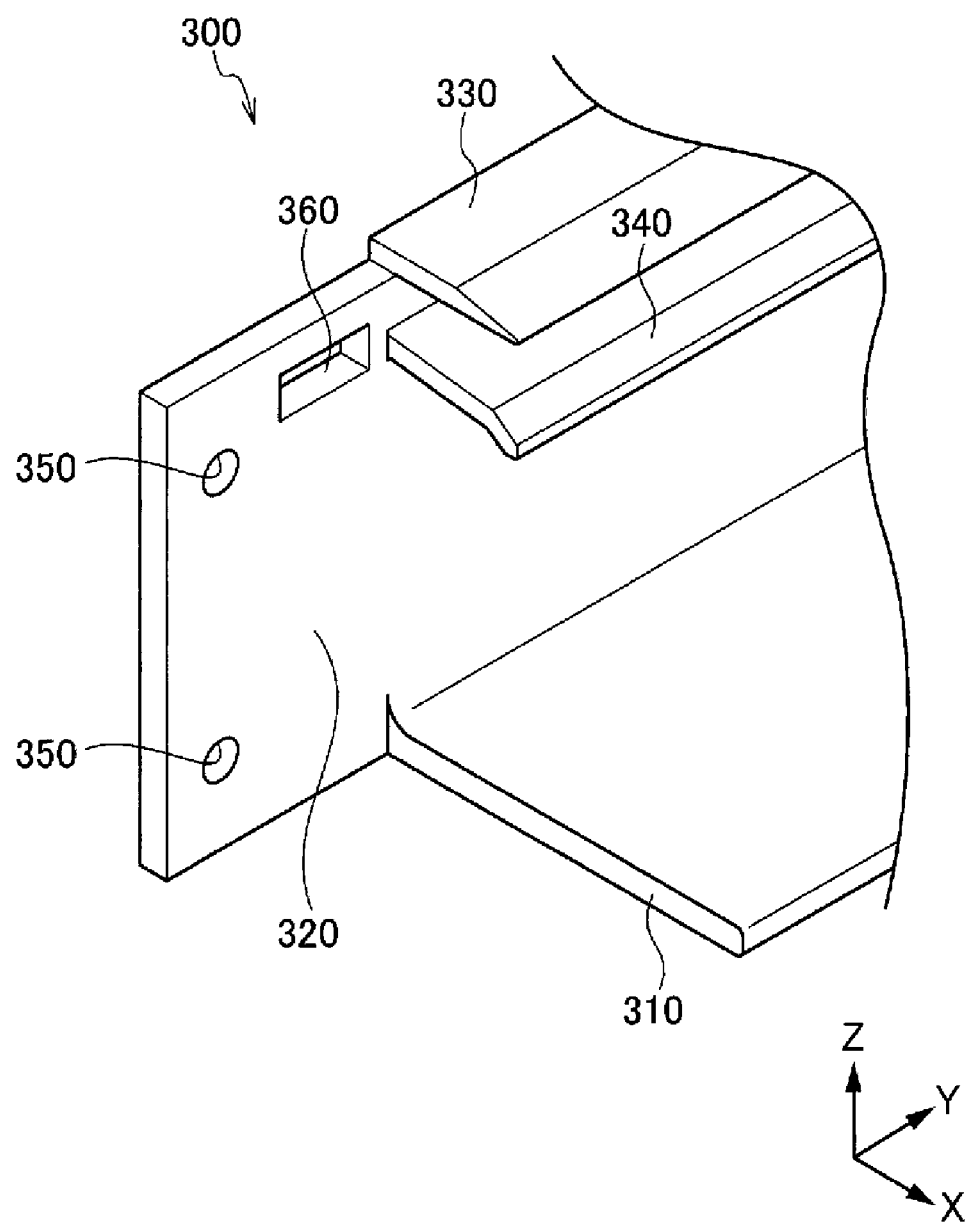
FIG. 10 is a perspective view of the second frame.
Figure 11:
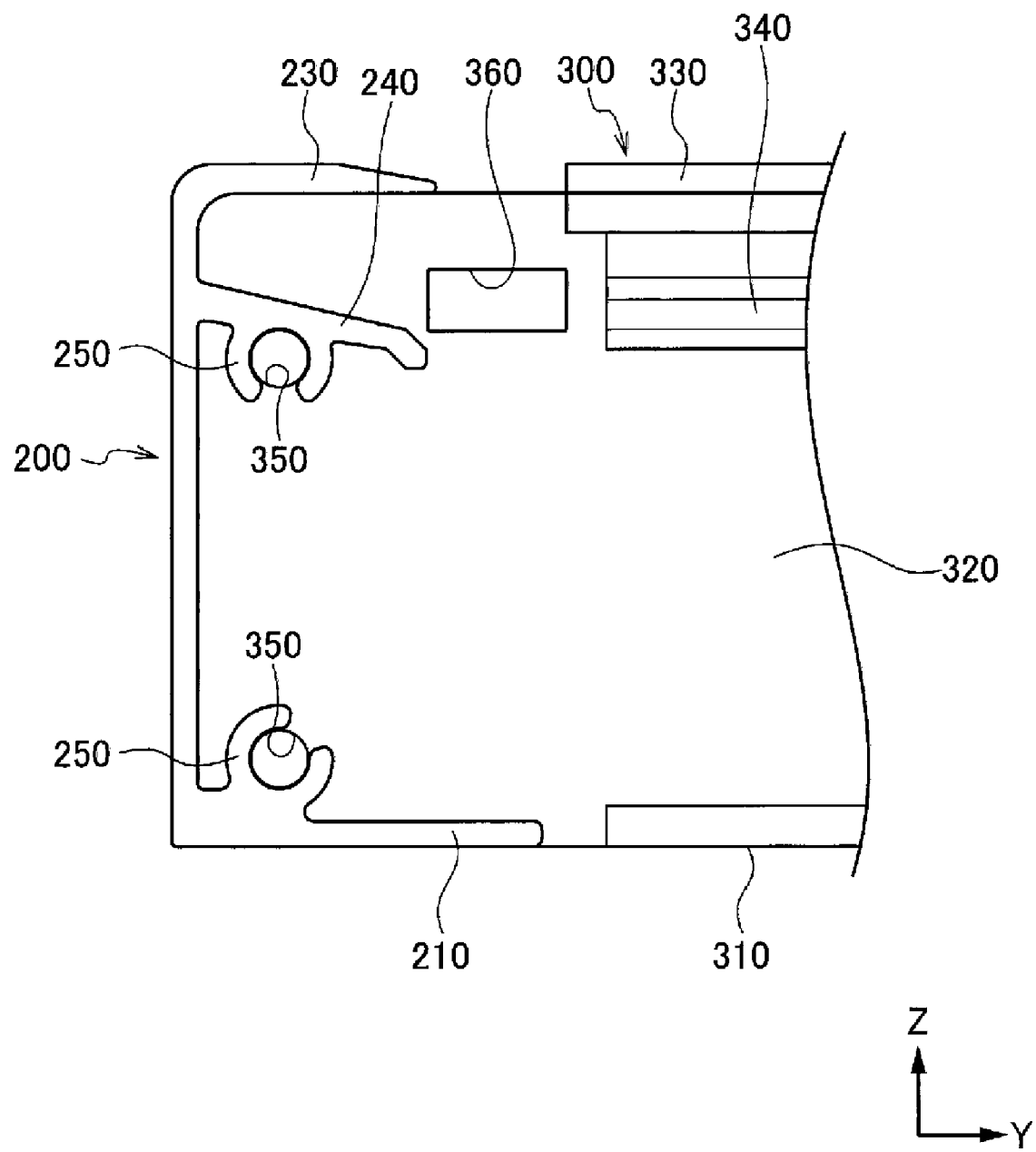
FIG. 11 is a diagram showing a state in which the first frame and the second frame are connected to each other.

FIG. 5 is a schematic cross-sectional view of the photoelectric conversion module 100 having a frame attached thereto. FIG. 6 is a side view of a first frame 200. FIG. 7 is a perspective view of the first frame 200. FIG. 8 is a side view of a second frame 300. FIG. 9 is a plan view of the second frame 300 as viewed in a different direction. FIG. 10 is a perspective view of the second frame 300. FIG. 11 shows a state in which the first frame 200 and the second frame 300 are connected to each other.

The first frame 200 may extend along a short side among the four sides of the photoelectric conversion panel. The first frame 200 has a sidewall 220 longer than the thickness of the photoelectric conversion module 100 in the thickness direction of the photoelectric conversion module 100. A flange 230 and a holder 240 protrude from the sidewall 220 in a direction along a plate plane of the photoelectric conversion module 100. The flange 230 and the holder 240 are provided so as to be spaced apart from each other in the thickness direction of the photoelectric conversion module 100. One edge portion of the photoelectric conversion module 100 is sandwiched between the flange 230 and the holder 240 (see also FIG. 5). The flange 230 may protrude to be longer in the Y-direction in the drawings than the holder 240.

The first frame 200 may have a protrusion 210 on an opposite side to the flange 230 in the thickness direction of the photoelectric conversion module 100. The protrusion 210 may protrude in the direction along the plate plane of the photoelectric conversion module 100.

The first frame 200 has insertion holes 250 into which fastening members which are not shown are inserted. In the present embodiment, the insertion holes 250 are provided on an underside of the holder 240 and on a topside of the protrusion 210. Specifically, members with a C-shaped cross section extend in a direction in which the first frame 200 extends, from wall portions that form the protrusion 210 and the holder 240. Internal portions of the members with a C-shaped cross section form the insertion holes 250 into which fastening members are inserted.

The second frame 300 extends along a long side among the four sides of the photoelectric conversion panel. Namely, the second frame 300 extends in a direction orthogonal to the direction in which the first frame 200 extends (see also FIG. 11). The second frame 300 has a sidewall 320 longer than the thickness of the photoelectric conversion module 100 in the thickness direction of the photoelectric conversion module 100. A flange 330 and a holder 340 protrude from the sidewall 320 in the direction along the plate plane of the photoelectric conversion module 100. The flange 330 and the holder 340 are provided so as to be spaced apart from each other in the thickness direction of the photoelectric conversion module 100. One edge portion of the photoelectric conversion module 100 is sandwiched between the flange 330 and the holder 340.

The second frame 300 may have a protrusion 310 on an opposite side to the flange 330 in the thickness direction of the photoelectric conversion module 100. The protrusion 310 may protrude in the direction along the plate plane of the photoelectric conversion module 100.

The second frame 300 has insertion holes 350 into which fastening members which are not shown are inserted. The insertion holes 350 are through-holes that penetrate the sidewall 320. The insertion holes 350 are provided near an end portion of the second frame 300 in the direction in which the second frame 300 extends. With the first frame 200 and the second frame 300 intersecting each other at 90°, the insertion holes 350 of the second frame 300 are disposed in the same positions as the insertion holes 250 of the first frame 200 (see FIG. 11). In this state, fastening members which are not shown are inserted into the insertion holes 250 and the insertion holes 350, by which the first frame 200 and the second frame 300 are fastened to each other.

The protrusion 310, the flange 330, and the holder 340 of the second frame 300 together with the sidewall 320 extend in the Y-direction in the drawings. Note, however, that the protrusion 310, the flange 330, and the holder 340 do not extend to both ends of the second frame 300. This prevents the protrusion 310, the flange 330, and the holder 340 of the second frame 300 from interfering with the protrusion 210, the flange 230, and the holder 240 of the first frame 200, respectively. Note that the flange 330 may extend to be longer in the Y-direction in the drawings than the holder 340.

The second frame 300 may have other through-holes 360 that penetrate the sidewall 320. The through-holes 360 may be provided near both end portions of the second frame 300. Each through-hole 360 is provided at a location where the through-hole 360 overlaps a base of the holder 340, i.e., a portion of the holder 340 connected to the sidewall 320, as viewed in the direction in which the second frame 300 extends (Y-direction in FIG. 10). Specifically, in the thickness direction of the photoelectric conversion module 100 (Z-direction in FIG. 10), an upper edge of the through-hole 360 matches an upper edge of the base of the holder 340 or is located above the upper edge of the base of the holder 340. In the thickness direction of the photoelectric conversion module 100 (Z-direction in FIG. 10), a lower edge of the through-hole 360 matches a lower edge of the base of the holder 340 or is located below the lower edge of the base of the holder 340. Thus, the length of the through-hole 360 in the thickness direction of the photoelectric conversion module 100 matches or is longer than the length of the base of the holder 340 in the thickness direction of the photoelectric conversion module 100.

The through-hole 360 may be provided at least in a region between the holder 240 of the first frame 200 and the holder 340 of the second frame 300 in the Y-direction in the drawings. Furthermore, it is preferred that the through-hole 360 be provided at a location away from the holder 340 of the second frame 300 in the Y-direction in the drawings. The through-hole 360 may be located on an outer side (on an end side) to the flange 330 of the second frame 300 in the Y-direction in the drawings. Alternatively, a part of the through-hole 360 may partially overlap the flange 330 in the thickness direction of the photoelectric conversion module 100.

It is preferred that the through-hole 360 be located on an outer side (more on an end portion side) than the flange 230 of the first frame 200 in the Y-direction in the drawings. Note, however, that the through-hole 360 may partially overlap the flange 230 in the thickness direction of the photoelectric conversion module 100.

The photoelectric conversion module 100 may be mounted on, for example, a sloped installation surface such as a roof of a building. In this case, the second frames 300 may be disposed on an upper side and a lower side of the photoelectric conversion module 100. Note that a direction going from a higher part to a lower part of the sloped installation surface along the line of greatest slope is referred to as "flow direction", and an upstream side of the flow direction is referred to as "upper side". A downstream side of the flow direction is referred to as "lower side". The through-holes 360 of the second frames 300 have a function of draining a liquid such as rain adhered onto the photoelectric conversion module 100.

As described above, the contents of the present invention have been disclosed through the embodiments. However, it should not be understood that the description and drawings forming a part of the present disclosure limit the present invention. From this disclosure, various alternative embodiments, examples, and operation techniques will be apparent to those skilled in the art. Therefore, the technical scope of the present invention is determined only by the matters specifying the invention according to the claims that are appropriate from the above description.

For example, in the above-described embodiment, the insulator 60 is provided between the positive-polarity wiring 50 and the glass substrate 20. Alternatively, the insulator 60 may be provided between the negative-polarity wiring 50 and the glass substrate 20 instead of between the positive-polarity wiring 50 and the glass substrate 20 if the photoelectric conversion cells are influenced by the negative-polarity wiring 50.

REFERENCE SIGNS LIST

100 Photoelectric conversion module
12 Photoelectric conversion cell
20 Glass substrate
50 Wiring
60 Insulator

The invention claimed is:

1. A photoelectric conversion module comprising:
a photoelectric conversion element;
a sealing layer sealing at least a back side of the photoelectric conversion element; and,
a protective sheet provided on a backside of the sealing layer, wherein
the photoelectric conversion element comprises:
a glass substrate;
a photoelectric conversion cell provided on a first surface side of the glass substrate;
a pair of wirings electrically connected to the photoelectric conversion cell, the wirings pulled out to a second surface side of the glass substrate, the second surface side being an opposite side of the first surface side of the glass substrate; and
an insulator provided between a positive-polarity wiring of the pair of wirings and the second surface side of the glass substrate, wherein
a material forming the insulator is different from a material forming the sealing layer.

2. The photoelectric conversion module according to claim 1, wherein a width of the insulator in a first direction orthogonal to a second direction in which the positive-polarity wiring extends on the second surface side of the glass substrate is larger than a width of the positive-polarity wiring in the first direction.

3. The photoelectric conversion module according to claim 1, wherein an electrical resistivity of the insulator is greater than an electrical resistivity of the glass substrate.

4. The photoelectric conversion module according to claim 1, wherein an electrical resistivity of the insulator is $10^{15}$ [Ωcm] or more.

5. The photoelectric conversion module according to claim 2, wherein an electrical resistivity of the insulator is greater than an electrical resistivity of the glass substrate.

6. The photoelectric conversion module according to claim 2, wherein an electrical resistivity of the insulator is $10^{15}$ [Ωcm] or more.

7. The photoelectric conversion module according to claim 3, wherein an electrical resistivity of the insulator is $10^{15}$ [Ωcm] or more.

8. The photoelectric conversion module according to claim 1, wherein the insulator is constructed by an insulating tape extending along the positive-polarity wiring of said wirings.

* * * * *